US 9,142,962 B2

(12) United States Patent
Russell et al.

(10) Patent No.: US 9,142,962 B2
(45) Date of Patent: Sep. 22, 2015

(54) WALL BOX DEVICE FOR MANAGING ENERGY

(75) Inventors: James K. Russell, Salt Lake City, UT (US); David Lynn Bytheway, Salt Lake City, UT (US); William Richard Schonle, Salt Lake City, UT (US)

(73) Assignee: Control4 Corporation, Salt Lake City, UT (US)

( * ) Notice: Subject to any disclaimer, the term of this patent is extended or adjusted under 35 U.S.C. 154(b) by 335 days.

(21) Appl. No.: 13/598,076

(22) Filed: Aug. 29, 2012

(65) Prior Publication Data

US 2013/0057247 A1 Mar. 7, 2013

Related U.S. Application Data

(60) Provisional application No. 61/528,525, filed on Aug. 29, 2011.

(51) Int. Cl.
  *G05F 1/455* (2006.01)
  *H02J 3/14* (2006.01)
  *G01R 21/00* (2006.01)

(52) U.S. Cl.
  CPC ............ *H02J 3/14* (2013.01); *G01R 21/006* (2013.01); *H02J 2003/143* (2013.01); *Y02B 70/3225* (2013.01); *Y02B 70/3266* (2013.01); *Y04S 20/222* (2013.01); *Y04S 20/242* (2013.01)

(58) Field of Classification Search
  CPC ..... G05K 1/445; G05K 1/455; B23K 11/248; Y02B 70/126; H02M 1/083; H02M 5/293
  USPC .......... 323/207, 905, 235, 237, 238, 241, 246
  See application file for complete search history.

(56) References Cited

U.S. PATENT DOCUMENTS 4,992,904 A 2/1991 Spencer et al.
6,671,635 B1 12/2003 Forth et al.
(Continued)

FOREIGN PATENT DOCUMENTS

EP 2 012 133 7/2009

OTHER PUBLICATIONS

International Preliminary Report on Patentability issued for International Application No. PCT/US2012/052906 on Mar. 13, 2014.
(Continued)

*Primary Examiner* — Adolf Berhane
(74) *Attorney, Agent, or Firm* — Austin Rapp & Hardman

(57) ABSTRACT

An electronic device for managing energy is described. The electronic device includes a voltage sensor module that monitors a voltage waveform. The voltage sensor module includes discrete components. The electronic device includes a current sensor module that monitors a current waveform. The current sensor module includes discrete components. The electronic device is coupled to the voltage sensor module and to the current sensor module. The computing module determines a phase margin based on the voltage waveform and the current waveform. The electronic device includes a control module coupled to the computing module. The control module controls a load based on the voltage waveform, current waveform and phase margin. The control module includes discrete components. The voltage sensor module, the current sensor module, the computing module and the control module are housed within a wall box.

18 Claims, 10 Drawing Sheets

(56) References Cited

U.S. PATENT DOCUMENTS

| | | | |
|---|---|---|---|
| 6,678,621 B2 | 1/2004 | Wiener et al. | |
| 7,336,463 B2 | 2/2008 | Russell et al. | |
| 7,468,877 B2 * | 12/2008 | Oki et al. | 361/93.1 |
| 2002/0077729 A1 * | 6/2002 | Anderson | 700/291 |
| 2007/0223160 A1 | 9/2007 | Coffey et al. | |
| 2008/0002439 A1 * | 1/2008 | Allinder | 363/21.01 |
| 2010/0109619 A1 | 5/2010 | Tsou et al. | |
| 2010/0207594 A1 | 8/2010 | Davoudi et al. | |
| 2011/0098867 A1 | 4/2011 | Jonsson et al. | |
| 2011/0266974 A1 * | 11/2011 | Thornton et al. | 315/297 |

OTHER PUBLICATIONS

Web-Mo. E-Mon D-Mon Energy Monitoring Products & Systems, Manual [online], E-Mon Corporation, 2009 [retrieved on Nov. 5, 2012], retrieved from the internet: <URL: http://web.archive.org/web/20100415112117/http://www.emon.com/techspecs/webmon_spec.pdf>, pp. 1-2.

International Search Report issued for International Application No. PCT/US2012/052906 on Nov. 28, 2012.

Extended European Search Report issued for European Patent Application No. 12828821.4 on Mar. 20, 2015.

* cited by examiner

WALL BOX DEVICE FOR MANAGING ENERGY

RELATED APPLICATIONS

This application is related to and claims priority from U.S. Provisional Patent Application Ser. No. 61/528,525, filed Aug. 29, 2011, for "WALL BOX DEVICE FOR MANAGING ENERGY," which is incorporated herein by reference.

TECHNICAL FIELD

The present disclosure relates generally to electronic devices. More specifically, the present disclosure relates to a wall box device for managing energy.

BACKGROUND

In recent years, the price of electrical devices has decreased dramatically. In addition, the size of electrical devices has continued to decrease. Further, electrical devices continue to increase in capability and convenience.

Decreasing prices and increasing capabilities of electrical devices has permitted modern devices to be conveniently used in homes and businesses. Many homes and businesses include multiple electrical devices to assist in everyday tasks. While these electronic devices may provide convenience and entertainment, many also require control. Moreover, these electronic devices consume electrical power and may consume other resources. The ever-increasing cost of resources, such as electricity, may be a concern.

With more and more electrical devices being used in homes and businesses that consume more and more electrical power, improved energy management features are needed. As illustrated by this discussion, improved energy management of electrical power consumption may be beneficial.

DETAILED DESCRIPTION

Figure 1:
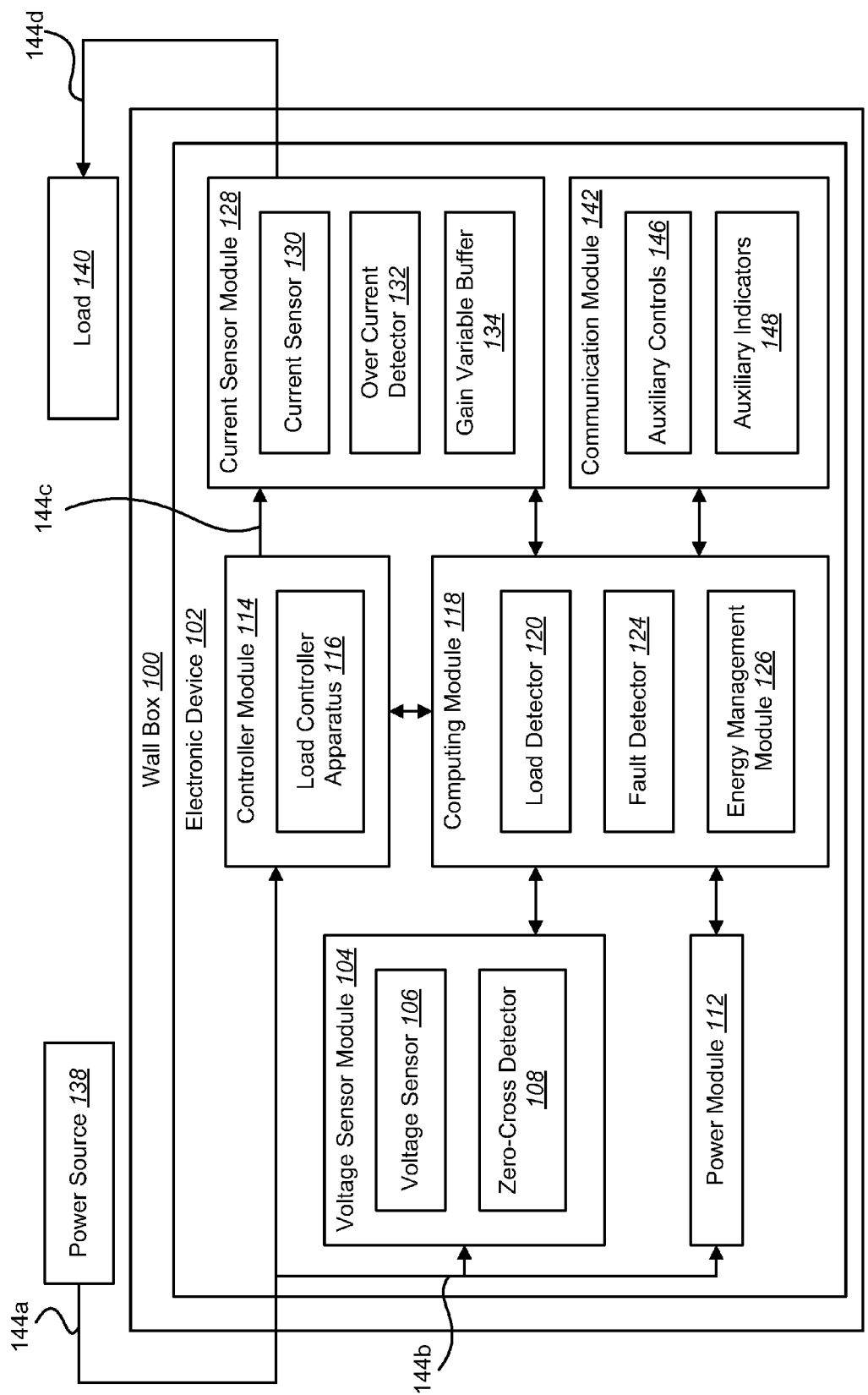
FIG. 1 is a block diagram illustrating one configuration of an electronic device for controlling a load with energy management features.

An electronic device for managing energy is disclosed. The electronic device includes a voltage sensor module that monitors a waveform. The voltage sensor module includes discrete components. The electronic device also includes a current sensor module that monitors a current waveform. The current sensor module includes discrete components. The electronic device also includes a computing module coupled to the voltage sensor module and to the current sensor module. The computing module determines a phase margin based on the voltage waveform and the current waveform. The electronic device also includes a control module coupled to the computing module. The control module controls a load based on the voltage waveform, current waveform and phase margin. The control module also includes discrete components. The voltage sensor module, current sensor module, computing module and control module are housed within a wall box. The wall box may be approximately 86 millimeters tall, 86 millimeters wide and 35 millimeters deep.

The electronic device may also include a zero-cross sensor for aligning the voltage waveform and the current waveform. The zero-cross may include discrete components. The electronic device may also include a fault detector for detecting whether the current waveform exceeds a threshold. The fault detector may include discrete components. If the fault detector detects that the current waveform exceeds a threshold, the control module may disengage the load. The threshold may correspond to a first level of sensitivity during startup of the electronic device. The threshold may correspond to a second level of sensitivity during regular operation of the electronic device.

The computing module may manage energy usage of the load. Managing energy usage of the load may include determining a type of the load based on the phase margin. Managing energy usage may also include adapting the way the load is driven based on the type of the load. Managing energy usage may also include determining a power factor of the load. Managing energy usage may also include reporting energy usage to another electronic device.

A method for managing energy with an electronic device is also disclosed. The method includes monitoring a voltage waveform from a voltage sensor module in the electronic device. The voltage sensor module includes discrete components. The method also includes monitoring a current waveform from a current sensor module in the electronic device. The current sensor module includes discrete components. The method also includes determining a phase margin based on the voltage waveform and the current waveform from a computing module in the electronic device. The computing module is coupled to the voltage sensor module and the current sensor module. The method also includes controlling a load based on the voltage waveform, current waveform and phase margin from a control module in the electronic device. The control module includes discrete components. The voltage sensor module, current sensor module, computing module and control module are housed within a wall box.

The systems and methods disclosed herein include a wall box device for managing energy. For example, an electrical device (e.g., switch, dimmer, etc.) may be included within a wall box capable of controlling electrical power delivered to a load.

A wall box (e.g., electrical box, outlet box, switch box, pattress, etc.) is the container for the body of an electrical device (e.g., light switch, power outlet) so that the face of the electrical device is flush with a wall. In general, the width of a wall box is measured in "gangs" which indicates the number of electrical devices (e.g., light switch, power outlet) that it can hold. For example, a single gang wall box can hold a single electrical device (e.g., light switch, power outlet) and a double gang wall box can hold two electrical devices (e.g., light switch, power outlet) side by side. The depth of a wall box may be standard depth, shallow depth, or deep depth. For purposes of the systems and methods disclosed herein, a wall box is a single gang standard depth wall box and a wall box device is an electronic device that may be held in a single gang standard depth wall box. In one configuration, a European style wall box having a width of 86 millimeters, a height of 86 millimeters and a depth of 35 millimeters may be used. In another configuration, a United States style, single gang, standard depth wall box may be used.

A wall box switch is an electronic device with two discrete states that may be used to control a load. A wall box switch may be in an "off" state or in an "on" state. Thus, a wall box switch may turn on or off electrical power to the load. In one configuration, a wall box switch may use a relay (e.g., mechanical, solid state, etc.) to turn on or off electrical power to the load. A simple example of a wall box switch is a light switch that turns on or off electrical power to a light. The light switch may turn on the light by turning on electrical power to the light or turn off the light by turning off electrical power to the light.

A wall box dimmer is an electronic device with variable states that may be used to control a load. A wall box dimmer may variably adjust the amount of electrical power that is driven to the load (e.g., by adjusting the root mean square (RMS) voltage, adjusting pulse-width modulation, adjusting duty cycle, etc.). For example, a wall box dimmer may provide 0% electrical power, 100% electrical power or some percentage in between. In one configuration, a wall box dimmer may use a semiconductor (e.g., metal-oxide-semiconductor field-effect transistor (MOSFET), triode for alternating current (TRIAC), transistors, etc.) to control the load. A simple example of a wall box dimmer is a light dimmer which may turn on or off and variably control the brightness of a light. For example, the light dimmer may increase the brightness of the light by increasing the amount of electrical power driven to the light. Similarly, the light dimmer may decrease the brightness of the light by decreasing the amount of electrical power driven to the light. In some configurations, the wall box device may include switching and dimming capabilities.

The wall box device (e.g., switch, dimmer, etc.) may control (e.g., drive) a load. Examples of loads include lights, motors, appliances, electronic devices, etc. Examples of types of lights include incandescent, arc, gas discharge, laser, fluorescent, light emitting diode (LED), sulfur, etc. Examples of types of motors include ceiling fan, exhaust fan, pump, etc. Examples of appliances include stoves, refrigerators, heaters, air-conditioners, etc. Examples of electronic devices include computers, televisions, game consoles, wireless devices, semiconductor devices, etc. The type of load may determine whether the wall box device functions as a switch and/or dimmer, depending on the capabilities of the load. A load may be characterized as one of three different types of impedances. Practically speaking, a load includes all three types of impedances. However, in each case, one type of impedance may dominate. The different types of impedances are resistive impedance, inductive impedance and capacitive impedance. For example, motors, electronics, low voltage fans, pumps, gate openers, etc. are inductive loads. Compact florescent lights and LED lights, etc. are capacitive loads. Heating elements, etc., are resistive loads.

A wall box device with energy management features may include a voltage sensor, a current sensor, and a zero-cross detector. The voltage sensor may capture the voltage waveform. The current sensor may capture the current waveform. The zero-cross detector may align the voltage waveform and the current waveform so that the phase margin (e.g., the difference in phase between the voltage waveform and the current waveform) may be determined. The voltage waveform, current waveform and phase margin may be used for obtaining a more accurate power measurement. For example, a load that includes inductive impedance and/or capacitive impedance will cause a phase shift between the voltage waveform and the current waveform. This means that the peaks of the voltage waveform and the peaks of the current waveform will not coincide. If the voltage waveform and the current waveform are analyzed alone with this phase shift between the waveforms, then a measurement at the peak of one of the waveforms will coincide with a measurement not at a peak of the other waveform leading to inaccurate power readings. However, if the phase margin is used along with the voltage waveform and the current waveform, then any phase shift between the waveforms may be compensated so that the peak of one of the waveforms will be analyzed with the peak of the other waveform leading to accurate power readings. Thus, for accurate power readings, the phase margin may be used to compensate for the phase shift between the voltage and current waveforms. The voltage waveform, current waveform and phase margin may be used to accurately determine a voltage measurement in RMS volts, a current measurement in RMS current, a watts measurement, a volt-ampere measurement and a power factor measurement. The wall box device may continuously monitor the voltage waveform, current waveform and phase margin for changes in these measurements.

Knowing the voltage waveform, the current waveform and the phase margin may also improve energy management features. Energy management features may include the ability to perform energy measurement functions, perform load compatibility, adapt the how the load is driven based on the type of the load, perform peak current fault detection, perform overload fault detection, monitor energy usage and report energy use.

The wall box device may perform energy measurement functions. Performing energy management functions may include determining RMS voltage, RMS current, watts, volt-amperes, true power measurements and power factor. These measurements may be determined from the voltage waveform, the current waveform and the phase margin. For example, the RMS voltage may be determined from the voltage waveform. Similarly, the RMS current may be determined from the current waveform. Watts is the real power in the circuit and may be determined by multiplying the voltage waveform and the current waveform while accounting for the appropriate phase margin adjustment. Volt-amperes is the apparent power in the electrical circuit and may be found by multiplying the RMS voltage and RMS current. The power factor may be determined by determining the ratio of real power (e.g., watts) and apparent power (e.g., volt-amperes). The energy measurement functions may be performed continuously and may provide real time data.

In one configuration, the energy measurement functions of the wall box device may be supplied by sampling the voltage and current waveforms for one (1) cycle of an alternating current (AC) signal. The wall box device may use the zero-cross signal to align the sampling of these two waveforms. Samples may then be taken and calculated and reported periodically. From these samples it may be possible to get a voltage measurement in RMS volts, a current measurement in RMS current, a watts measurement, a volt-ampere measurement and a power factor measurement.

The wall box device may perform load compatibility. Performing load compatibility may include determining the type of load that is connected to the wall box device. The voltage waveform, the current waveform and/or the phase margin may be used to identify the type of the load being driven (e.g., the type of impedance, the proportion of each type impedance contained in the load). In some configurations, the phase margin may be used to determine the type of load. For example, inductive loads may be characterized by the voltage waveform leading the current waveform, capacitive loads may be characterized by the current waveform leading the voltage waveform and resistive loads may be characterized by the voltage waveform and the current waveform being in sync. The shape of the current waveform and/or the voltage waveform may also be used to identify the type of load. For example, the harmonic components of the waveform may be analyzed to determine the type of the load. The behavior of real loads have indicated that more than a phase angle may be used to determine the type of load being driven (e.g., capacitive, inductive, resistive). The systems and methods used to capture the voltage waveform and the current waveform may maintain waveform fidelity, out to approximately the 10th harmonic, so that unusual loads, such as compact fluorescent and LED lighting can be accurately measured. Moreover, the shape of the waveform and waveform fidelity (e.g., out to the 10th harmonic) may be used to identify the type of load and other load characteristics. In some configurations, a combination of multiple load detection techniques (e.g., based on the phase margin, based on the shape of the current waveform and/or the voltage waveform, etc.) may be used to determine the type of the load that is being driven.

The wall box device may adapt how the load is driven based on the type of the load. Adapting how the load is driven based on the type of the load may include adjusting the driving voltage waveform and/or current waveform to enhance efficiency (e.g., increase the power factor by adjusting the phase margin). For example, a wall box device may be coupled to an inductive impedance (e.g., ceiling fan). In this case, the wall box device may increase its capacitive impedance to reduce the phase margin and thus increase the power factor of the circuit. In another example, a wall box device may be coupled to a capacitive impedance (e.g., compact fluorescent lamp). In this case, the wall box device may increase its inductance to reduce the phase margin and thus increase the power factor of the circuit. In one configuration, a wall box dimmer may additionally or alternatively adjust the duty cycle and/or the amount of power delivered to the load to enhance efficiency (e.g., limiting the watts provided to correspond with the watts consumed).

The wall box device may perform peak current fault detection. Performing peak current fault detection may protect the load and/or the wall box device from large amounts of current (e.g., a short circuit, current spike, over current, etc.). For example, a large amount of current may cause a semiconductor load driver (e.g., MOSFET, TRIAC, transistor, solid state relay, etc.) and/or the wiring to overheat and self destruct. A wall box device may include fault detection circuitry (e.g., a windowed peak detector) to detect number of fault conditions (e.g., a peak current fault) and to immediately disengage the load (e.g., turn off the wall box device, disengage the load control mechanism) if a specific fault condition (e.g., peak current) is detected. The peak fault detection circuitry may continuously monitor the current (e.g., current waveform, RMS current, peak current, etc.) passing to the load, comparing it to a preset level. If the current exceeds the preset level in either a positive direction or in a negative direction, the peak fault detection circuitry may immediately disengage the load.

In one configuration, the peak fault detection circuitry sends an immediate disengage command to the semiconductor load driver. Thus, the peak fault detection circuit may disengage the load before the peak current fault causes the semiconductor load driver to self destruct.

In many cases, the peak fault detection circuitry may allow the wall box device to recover completely from a direct short circuit across the load either at power up or during operation. In some configurations, the wall box device may reset itself upon the occurrence of a peak current fault.

Some loads have a large amount of inrush current especially when they are cold (haven't been turned on for a long time). Thus, a change in the sensitivity of the peak current fault detect may be beneficial. In one configuration, the output of the current sensor may be amplified before it is passed to the peak fault detection circuit. In this configuration, a gain variable buffer may be used to change the gain of the amplifier and thus adjust the sensitivity of the peak fault detection circuit. The gain variable buffer may be used to adjust the sensitivity of the peak fault detection circuit over a continuum of sensitivity levels. The continuum of sensitivity levels may allow for the sensitivity levels to be specifically tailored to the load that is being driven. This may provide better performance in protecting both a load control device (e.g., MOSFET) and the load and wiring, which may allow a configuration (e.g., lighting) to be safer through the use of more gain values and/or time-based monitoring. For example, a specific load may have a specific inrush current and settling time specifications. The gain values may be time-based adjusted to adjust the sensitivity levels so that they track the specific inrush current and settling time specifications of the load. In some configurations, time-based monitoring may be used to adjust between multiple gain values. The sensitivity levels may be adjusted multiple times during the operation of the load to adjust for current variations (e.g., inrush current, settling time, changes in the load, etc.) In one instance, the gain variable buffer may be used to changes the sensitivity of the peak fault detection circuit between two values. Thus, the value of the gain variable buffer may be set to a very low sensitivity during startup and then increased to a normal sensitivity for monitoring and energy measurement during normal running condition. For example, for a tungsten load of 500 watts, the wall box device fault detect circuit may be set for a 42 ampere trip point for the first 16 cycles of AC current during startup, and then switched to a 10 ampere trip point for normal running and energy measurement.

The wall box device may perform overload fault detection. Performing overload fault detection may protect the load and/or the wall box device from continuous current overload conditions. The wall box device may include overload fault detection circuitry to detect an overload condition and to disengaging the load (e.g., turn off the wall box device). An overload condition may occur when the continuous current delivered to the load is over a set threshold for a certain length of time. For example, in one configuration, an overload circuit will disengage the load if the current delivered to the load exceeds 2.5 amperes for 10 seconds. This may protect the load and/or the wall box device from overheating and eventual failing when more wattage is being drawn than can be safely delivered.

The wall box device may manage energy usage. Managing energy usage may include monitoring energy usage and reporting energy usage. The wall box device may include energy monitoring circuitry to monitor energy usage. Monitoring and reporting energy usage may enhance the energy usage experience. For example, energy usage inconsistencies may be discovered. In one configuration, a wall box device may detect a load and monitor the energy usage for inconsistencies. For instance, a wall box device may detect that its load is an array of compact fluorescent lamps. If the operating power is detected to be 500 watts, then the energy monitoring circuitry may report inconsistencies (e.g., burnt out light bulb, bulb malfunction, wiring malfunction, additional impedance, etc.) if the measured power changes to a different value (e.g., 400 watts, 600 watts). In another configuration, a wall box device may be programmed so that the wall box device includes a set of specific operating parameters that are associated with the load that is being driven. For instance, a wall box device may be programmed to control a set of five 100 watt light bulbs. In this case the wall box device will expect to measure a 500 watt load. If the wall box device measures that the load is only 400 watts, then the wall box device may report a load error. More specifically, the wall box device may report that one of the 100 watt light bulbs is not operating. If the wall box device measures that the load is 600 watts, then the wall box switch may report a load error. In this case the wall box device may indicate a bulb malfunction, wiring error or the presence of an additional impedance in the load. In another example, a wall box device may detect a failed load controller, such as a shorted MOSFET, when the energy monitoring circuitry detects that current is flowing in the load even though the load controller is commanding a full 'OFF' condition.

The wall box device may report energy management values to another electronic device. The wall box device may report the full energy usage numbers. For example, the wall box device may report the actual power used. In one instance, the wall box device may report the total power use over a specified time horizon. The wall box device may additionally report the type of load, the normal operating conditions of the load, inconsistencies with the load, fault conditions of the load, etc. Reports may be made continuously, periodically and/or on demand. Reported data may be used to enhance the operation of the circuit including providing data to create better fault and overload conditions. The wall box device may additionally report to another electronic device (e.g., control system) that a fault condition has occurred. The wall box device may be reset by another electronic device (e.g., control system) as needed.

Various configurations are now described with reference to the figures, where like reference numbers may indicate functionally similar elements. The systems and methods as generally described and illustrated in the figures herein could be arranged and designed in a wide variety of different configurations. Thus, the following more detailed description of several configurations, as represented in the figures, is not intended to limit scope, as claimed, but is merely representative of the systems and methods. As used herein, the term "plurality" may indicate two or more. For example, a plurality of components refers to two or more components.

FIG. 1 is a block diagram illustrating one configuration of an electronic device 102 for controlling a load 140 with energy management features. The electronic device 102 may be housed within a wall box 100. The electronic device 102 may include a voltage sensor module 104, a current sensor module 128, a computing module 118 and a controller module 114. The computing module 118 may be coupled to the voltage sensor module 104 and to the current sensor module 128. The computing module 118 may be coupled to the controller module 114. In addition, the electronic device 102 may include a power module 112 and a communication module 142. The electronic device 102 may be coupled to a power source 138 and to a load 140. Examples of electronic devices 102 include electronic circuits, integrated circuits, circuits with discrete components (e.g., resistors, capacitors, transistors, etc.), devices with processors, computers, memory cells, latches, logic gates, etc. In one example, the electronic device 102 has a switch that includes discrete components and a microprocessor that may be used to control an electric load and/or manage resource consumption of an electric load. In another example the electronic device is a dimmer circuit including discrete components and a microprocessor that may be used to control an electric load and/or manage resource consumption of an electric load. As used herein, a "module" may be implemented in hardware, software, firmware or any combination thereof.

The voltage sensor module 104 may capture a voltage waveform. For example, the voltage sensor module 104 may continuously capture the voltage waveform by sampling the voltage waveform for one cycle of AC. The voltage sensor module 104 may include a voltage sensor 106. In some configurations, the voltage sensor module 104 may additionally include a zero-cross detector 108. The voltage sensor module 104 may include discrete components. In some configurations, the voltage sensor module 104 may only include discrete components.

The voltage sensor module 104 may capture a continuous time voltage waveform of an alternating current (AC) signal. For example, the voltage sensor module 104 may capture a continuous time voltage waveform of the line feed from the power source 138. The continuous time voltage waveform may capture how the voltage varies over each cycle of the AC signal. In some configurations, the electronic device 102 may use an analog to digital (A/D) converter for capturing a discrete time (e.g., digital) voltage waveform of an AC signal by sampling the continuous time voltage waveform captured by the voltage sensor 106. For example, the A/D converter may sample at sufficient intervals to capture how the voltage varies over one cycle of the AC signal.

The zero-cross detector 108 may be used to determine the zero crossings of an AC signal. For example, the zero-cross detector 108 may indicate the start and finish of one cycle of AC. In one configuration the zero-cross detector 108 may be implemented into the circuitry of the voltage sensor module 104. In another configuration, the zero-cross detector 108 may be an independent module. The zero-cross detector 108 may be used to align the sampling of the voltage waveform and the current waveform. For example, the samplings of the voltage sensor 106 and the samplings of the current sensor 130 may aligned with reference to time so that a phase margin between the voltage waveform and the current waveform may be determined.

The zero-cross detector 108 may additionally be used to determine the AC power frequency of a power source 138. For example, the zero-cross detector 108 may detect that the AC power frequency of the power source 138 is 60 Hertz. In another example, the zero-cross detector 108 may detect that the AC power frequency of the power source 138 is 50 Hertz (as may be used in Europe and parts of the Pacific Rim, for example). The electronic device 102 may automatically adjust for frequency differences based on the AC power frequency of the system. For instance, the duty cycle required to illuminate a light bulb at 50% brightness may be higher in a 50 Hertz system than it may be in a 60 Hertz system.

The current sensor module 128 may capture a current waveform. For example, the current sensor module 128 may continuously capture the current waveform by sampling the current waveform for one cycle of AC. The current sensor module 128 may include a current sensor 130, a gain variable buffer 134 and an over current detector 132. In some configurations, the current sensor 130, gain variable buffer 134 and/ or over current detector 132 may share discrete components (e.g., resistors, capacitors, transistors, amplifiers, chip packages, etc.) in performing respective functions of the current sensor module 128. In some implementations, the over current detector 132 may be included within the current sensor 130. In other implementations, the current sensor 130 may be included within the over-current detector 132. The current sensor module 128 may include discrete components. In some configurations, the current sensor module 128 may only include discrete components.

The current sensor 130 may capture a continuous time current waveform of an AC signal. For example, the current sensor 130 may capture a continuous time current waveform of the line feed from the power source 138. The continuous time current waveform may capture how the current varies over each cycle of the AC signal.

The gain variable buffer 134 may amplify the continuous time current waveform based on the appropriate gain. For example, the current sensor 130 may capture a continuous time current waveform with a very small magnitude. In this case, the captured continuous time current waveform may need to be amplified before further processing. The gain of the amplifier may change the magnitude of the continuous time current waveform. In one configuration, the gain of the gain variable buffer 134 may be adjusted dynamically. For example, the gain may be programmed to two or more values. In one instance, a gain may be set to a first smaller value during startup where a large current inrush is expected and then set to a second larger value during operation.

The over current detector 132 may be used to disengage the load 140 when an over (e.g., peak, threshold current) current fault occurs or other fault condition is detected. The over current detector 132 may continuously monitor the current being delivered to the load 140. The over current detector 132 may include multiple levels of sensitivity to account for the changing current needs of the load 140. For example, the over current detector 132 may include a first level of sensitivity and a second level of sensitivity. The first level of sensitivity may be set initially to a low level of sensitivity to allow for inrush or startup current to be delivered to the load 140. For instance, the low level of sensitivity may be used to permit a large inrush of current during startup that would otherwise be impermissible with a higher level of sensitivity. The second level of sensitivity may be adjusted or set to a higher level of sensitivity to allow for close monitoring of the operating current. Multiple levels of sensitivity may be used to allow for the current needs of a load. The levels of sensitivity may be time-based monitored and may change as the current needs of the load change.

The over current detector 132 may monitor the current passing to the load 140, comparing it to a preset or threshold level. If the current passing to the load exceeds this level, either in a positive or negative direction, the over current detector 132 may disengage the load, preventing large fault currents from flowing throughout the electronic device 102. The over current detector 132 may disengage the load 140 before the over current damages the load controlling apparatus (e.g., semiconductor, MOSFET, TRIAC, transistor, solid state relay, etc.) and/or the wiring. For example, continuous monitoring of a fault detector and the speed it operates may also be beneficial. It may be fast enough to prevent large fault currents from flowing, protecting both a MOSFET (or other control device) as well as the wiring. Thus, the over current detector 132 may allow the electronic device 102 to recover from a complete short circuit of the load 140. The over current detector 132 may be implemented in continuous time hardware to decrease the response time when an over current fault occurs. For example, the over current detector 132 may be implemented by passing the continuous time current waveform from the gain variable buffer 134 to a windowed peak detector. In one configuration, the windowed peak detector may send an immediately disengage signal to the load controller apparatus 116 when the preset level is exceeded. Thus, the electronic device 102 may immediately disengage in response to an over current fault before the load controlling apparatus self destructs.

The gain of the gain variable buffer 134 may be dynamically adjusted to different values to compensate for known times when a large inrush of current is permissible (e.g., during the first few cycles of startup). The perceived current is based on the gain of the gain variable buffer 134. Thus, the gain variable buffer 134 may adjust the sensitivity of the over current detector 132 by setting different gain values. For instance, the gain of the gain variable buffer 134 may be set to a very low value for very low sensitivity during startup and then set to a normal value for normal sensitivity for monitoring and energy measurement during normal running condition. For example, on a tungsten load of 500 watts, the computing module 118 may program the gain variable buffer 134 with a low gain so that the over current detector 132 is set for a 42 amp trip point for the first 16 cycles of AC current during startup and then switched to a higher gain so that the over current detector 132 is set for a 10 amp trip point for normal running and energy measurement.

The electronic device 102 may additionally include an A/D converter for capturing a discrete time (e.g., digital) current waveform of an AC signal by sampling the continuous time current waveform captured by the current sensor 130. For example, the A/D converter may sample at sufficient intervals to capture how the current varies over one cycle of the AC signal. The A/D converter may sample the current waveform to correspond to the sampling of the voltage waveform. Depending on the impedance of the circuit (e.g., the electronic device 102 and the load 140) there may be a phase shift between the voltage waveform and the current waveform. The zero-cross detector 108 may allow the samplings of the voltage waveform and the current waveform to be aligned so that a phase margin may be determined.

The computing module 118 may direct the operation of the electronic device 102. For example, a computing module 118 may include a microprocessor for controlling the electronic device 102. The computing module 118 may receive the discrete time voltage waveform, the discrete time current waveform and the output of the zero-cross detector 108. The computing module 118 may perform operations based on the voltage waveform, current waveform and zero-cross detector 108. For example, the computing module 118 may determine a phase margin between the voltage waveform and the current waveform. The phase margin may be determined by aligning the samples of the voltage waveform and the current waveform and determining the phase offset between the two waveforms. The voltage waveform, current waveform and phase margin may then be used for other operations. The computing module 118 may include a load detector 120, a fault detector 124 and an energy management module 126.

The load detector 120 may determine the type of load 140 that is coupled to the electronic device 102 based on the impedance of the load 140. For example, if there is a phase margin with the voltage waveform leading the current waveform, then the load 140 has inductive impedance. If the there is a phase margin with the current waveform leading the voltage waveform, then the load 140 has capacitive impedance. If there is no phase margin or a small phase margin (e.g., less than a threshold phase margin) between the voltage waveform and the current waveform, then the load 140 has resistive impedance. By mapping the characteristics of the impedance, the load detector 120 may determine more specifically the type of the load 140. For example, the characteristics of the phase margin and/or voltage/current waveforms of a capacitive impedance may coincide with the characteristics of a load 140 of a compact fluorescent lamps. The load detector 120 may adapt how the electronic device 102 drives the load based on the type of the load 140 (e.g., the type of impedance of the load). For example, the electronic device 102 may adjust the way it drives the load 140 (e.g., adjust the voltage waveform and/or current waveform) and/or adjust its own impedance to improve the efficiency (e.g., power factor) for the circuit. Thus, the electronic device 102 may negotiate with the load to enhance the efficiency of the circuit.

The fault detector 124 may disengage the load 140 to protect the electronic device 102 and/or the load 140 when the continuous current delivered to the load 140 is over a set threshold for a certain length of time. For example, the fault detector 124 may perform overload fault protection as described above.

It should be noted that the fault detector 124 and the over current detector 132 may be implemented in addition to or alternatively from each other and/or may coordinate operation. For example, one or more of the fault detector 124 and the over current detector 132 may be implemented. Additionally or alternatively, the fault detector 124 may be implemented in place of the over current detector 132 (e.g., the over-current detector 132 may instead be the fault detector 124) and/or vice-versa (e.g., the fault detector 124 may instead be the over-current detector 132). Additionally or alternatively, the over current detector 132 and the fault detector 124 may function in coordination with each other in some configurations.

The energy management module 126 may manage and/or report energy usage. For example, the voltage waveform, the current waveform and the phase margin may be used to more efficiently and effectively control a load 140 and to report the energy usage of the load 140. For example, the energy management module 126 may determine RMS volts, RMS current, watts, volt-amperes and power factor. The RMS volts may be determined from the voltage waveform. Similarly, the RMS current may be determined from the current waveform. Watts is the real power in the circuit and may be determined by multiplying the voltage waveform and the current waveform with the appropriate phase margin adjustment. Volt-amperes is the apparent power in the electrical circuit and may be found by multiplying the RMS voltage and RMS current. The power factor may be determined by determining the ratio of real power (e.g., watts) and apparent power (e.g., volt-amperes). These values may be used to more efficiently and effectively drive the load 140. In addition, these values may be reported to an external electronic device (e.g., central controller, server, etc.).

The values determined by the energy management module 126 may be used to determine and report inconsistencies with the load 140. For example, if a known 500 watt load 140 of lighting is operating at only 400 watts, then the energy management block/module 126 may report a problem with the load 140 (e.g., that one or more lights are burned out, wiring problem, etc.). In another example, if a known 500 watt load 140 is operating at 600 watts, then the energy management module 126 may report a problem with the load 140 (e.g., wiring problem, malfunction, etc.). Thus, a user may be immediately alerted to inconsistencies in the load. Energy management values may additionally be reported so that energy usage may be monitored and adjusted by a user. For example, a user that receives reports of a 600 watt load of lighting may dim the lights to reduce the load to 500 watts. Thus, reporting the energy management values may enhance the energy usage of one or more loads 140.

The controller module 114 may control the amount of power delivered to the load 140. In one configuration (e.g., switch), the control module 114 may turn on (e.g., enable) the power or turn off (e.g., disable) the power to the load 140. In another configuration (e.g., dimmer), the control module 114 may adjust the amount of power that is delivered to the load 140 (e.g., enable, disable, adjust duty cycle, etc.). The controller module 114 may include a load controller apparatus 116 for switching and/or dimming the power delivered to the load 140. Examples of load controller apparatus 116 include switches (e.g., mechanical relay, solid state relay, etc.) and dimmers (e.g., MOSFET, TRIAC, transistor, etc.). The controller module 114 may include discrete components. In some configurations, the controller module 114 may only include discrete components.

The power module 112 may convert the AC feed line power to low voltage direct current power for powering components of the electronic device 102. The power module 112 may include discrete components. In some configurations, the power module 112 may only include discrete components.

The communication module 142 may be used to communicate with another electronic device (e.g., wall box device, central controller, server, keypad, etc.). The electronic device 102 may communicate over a wired and/or wireless channel. The electronic device 102 may receive data from another electronic device (e.g., control commands, operating parameters of the load, operating parameters of the electronic device, configuration settings, firmware updates, etc.). The electronic device 102 may transmit data to another electronic device (e.g., energy measurement values, fault conditions, status notifications, real-time operating data, etc.). For example, an electronic device 102 may receive operating parameters about a load 140. Another electronic device may communicate with the electronic device 102 that the load is a series of five 100 watt light bulbs. The other electronic device may also communicate to the electronic device 102 a schedule for operating the load 140 and/or the amount of power that should be delivered to the load 140. The electronic device 102 may operate according to the parameters received from the other electronic device. The energy management features may allow the electronic device 102 to report the energy measurement values and the operating conditions of the load and/or circuit. The electronic device 102 may additionally report inconsistencies with the circuit (e.g., detect a burnt out light bulb, wiring problem, electrical malfunction, power hazard, etc.). For example, the electronic device 102 may determine that the five 100 watt light bulbs are only drawing 400 watts of power, indicating a burnt out light.

The communication module 142 may also include auxiliary controls 146 and auxiliary indicators 148. The auxiliary controls 146 may be in communication with another electronic device and/or interface for receiving input to the electronic device 102. In one configuration, the auxiliary controls 146 may be coupled to or housed within a wall box device 100. The auxiliary controls 146 may interact with the computing module 118 to provide instructions on specific conditions about controlling the load 140 or performing energy management functions. The auxiliary indicators 148 provide a visual indication of conditions of the load 140. For example, the auxiliary indicators 148 may include LEDs that indicate whether a load is being properly driven by the electronic device 102. The auxiliary indicators 148 may also indicate whether a fault condition has been triggered and/or whether the load controller apparatus 116 is currently in an on or off position.

The power source 138 may output high voltage (e.g., 240, 120) AC. The high voltage AC may be coupled to electronic device 102 through feed line 144a-c. The load 140 may be coupled to the electronic device 102 through feed line 144d. The current detector 130 may be in line with the feed line 144c and 144d so that load current may be determined.

Figure 2:
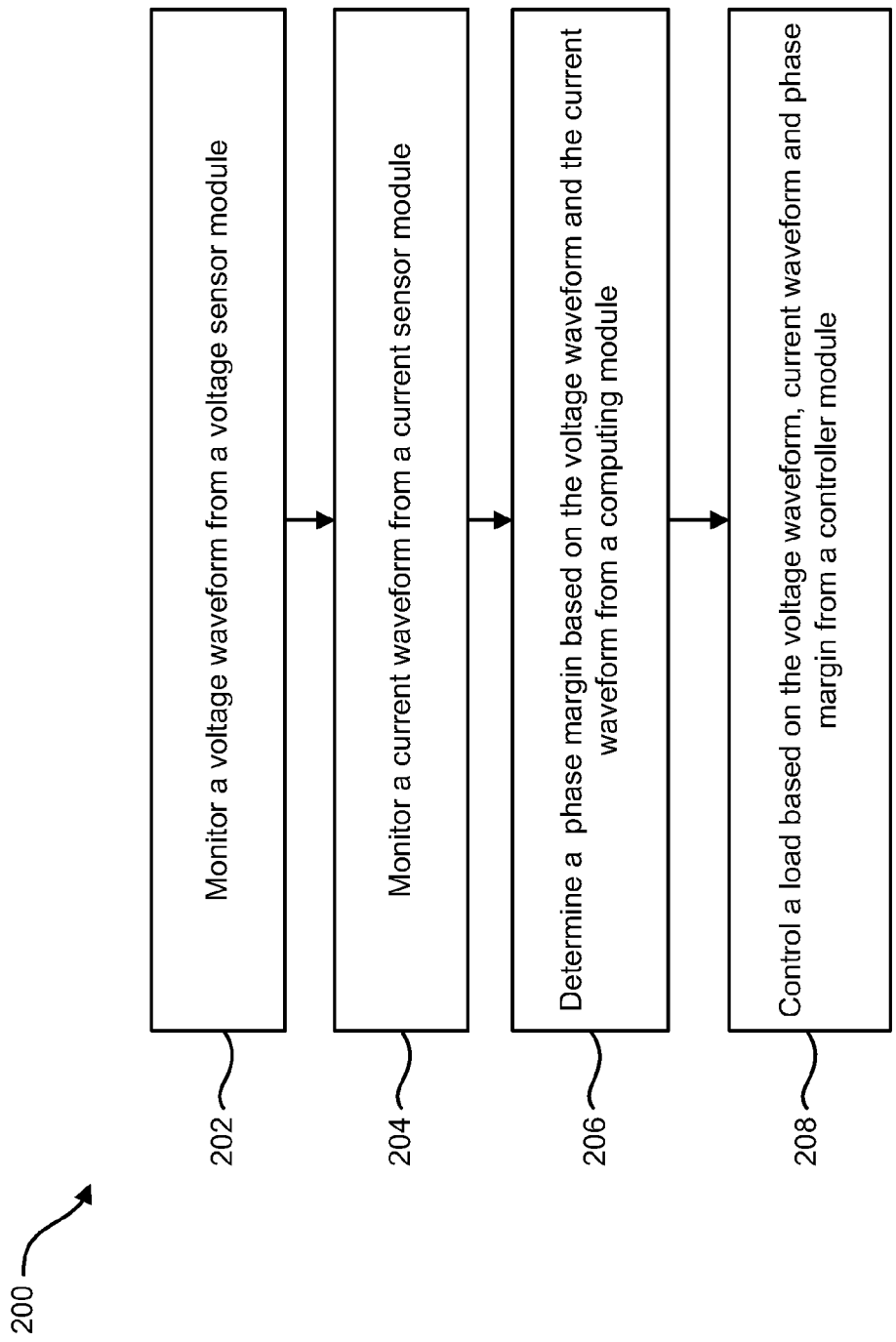
FIG. 2 is a flow diagram illustrating one configuration of a method for managing energy with an electronic device.

FIG. 2 is a flow diagram illustrating one configuration of a method for managing energy with an electronic device. An electronic device 102 may monitor 202 a voltage waveform from a voltage sensor module 104. The voltage sensor module 104 may be implemented in the electronic device 102. For instance, the voltage sensor module 104 may sample a continuous time voltage waveform to determine parameters of the signal and to determine how the signal varies over time. The voltage sensor module 104 may include discrete components.

The electronic device 102 may monitor 204 a current waveform from a current sensor module 128. The current sensor module 128 may be implemented in the electronic device 102. For instance, the current sensor module 128 may sample a continuous time current waveform to determine parameters of the signal and to determine how the signal varies over time. The current sensor module 128 may include discrete components.

The electronic device 102 may determine 206 a phase margin based on the voltage waveform and the current waveform from a computing module 118. The computing module 118 may be implemented in the electronic device 102. For instance, a computing module 118 may align corresponding time samples of the voltage waveform and the current waveform to determine the difference in the phase (e.g., phase offset, phase angle) between the voltage waveform and the current waveform. A zero-cross detector 108 may be used to time the sampling and for aligning the sampled values. If the peaks and zeros of the current waveform correspond to the timing of the peaks and zeros of the voltage waveform, then there would be a zero phase margin between the angles. If the voltage waveform leads the current waveform, then the phase margin will be the offset angle between the two waveforms. This may occur with inductive impedance. If the current waveform leads the voltage waveform, then the phase margin will be the offset angle between the two waveforms. This may occur with capacitive impedance. Determining the phase margin allows the actual power to be determined. The computing module 118 may be coupled to the voltage sensor module 104 and the current sensor module 128.

The electronic device 102 may control 208 a load 140 based on the voltage waveform, current waveform and phase margin from a controller module 114. The controller module 114 may be implemented in the electronic device 102. For instance, the electronic device 102 may change the way the controller module 114 drives the load 140 based on the impedance of the load 140 and the power at which load 140 is operating. The controller module 118 may include discrete components.

In some implementations, one or more of the voltage sensor 104, current sensor 128, computing module 118 and controller module 114 may include discrete components. In some configurations, one or more of the voltage sensor module 104, current sensor module 128, computing module 118 and controller module 114 may only include discrete components. The use of discrete components may be beneficial for allowing certain components of the electronic device 102 to be housed within a wall box 100. In some configurations, the electronic device 102 may be completely housed within a wall box 100.

Figure 3:
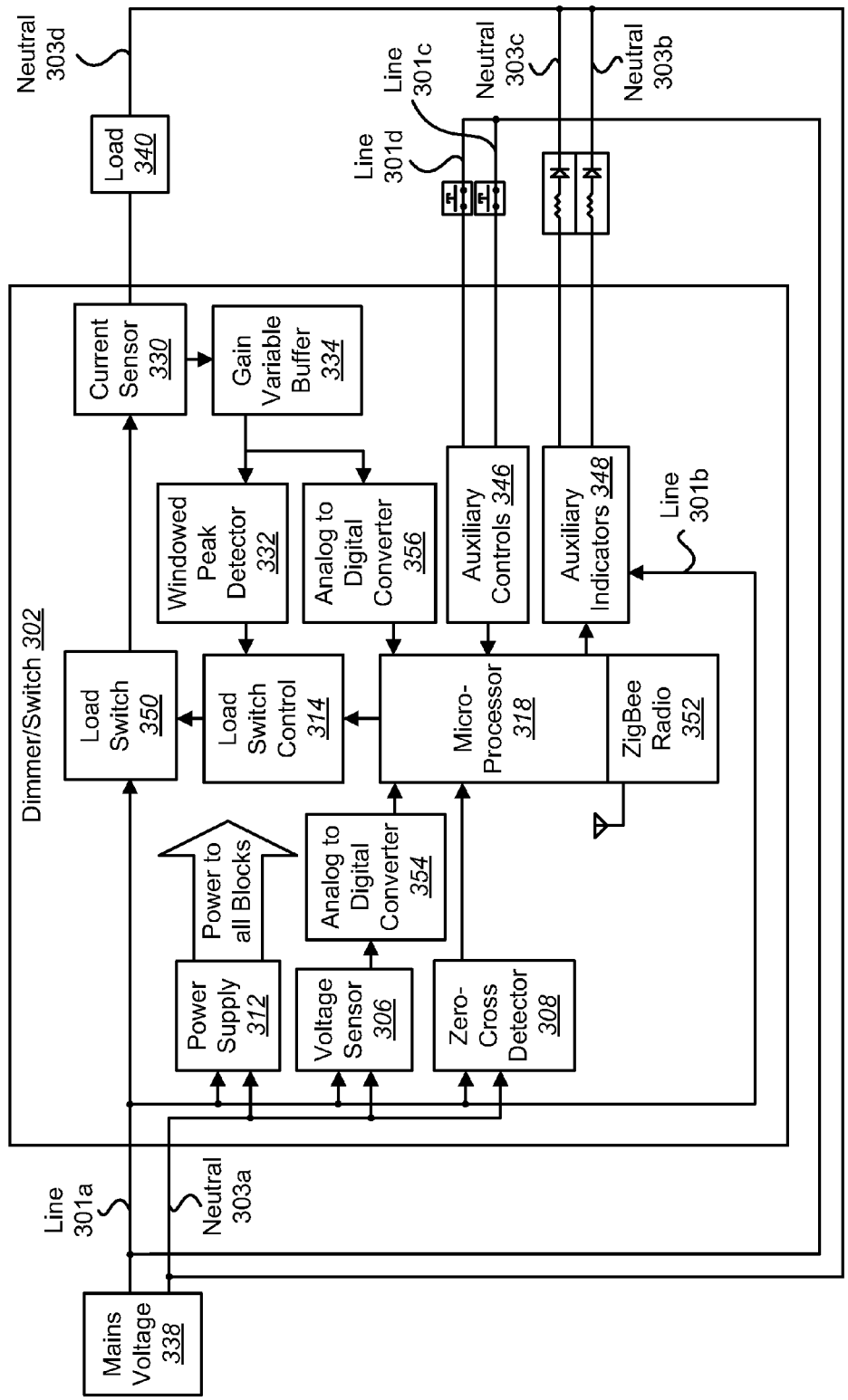
FIG. 3 is a block diagram illustrating one configuration of a dimmer/switch in which systems and methods for managing energy may be implemented.

FIG. 3 is a block diagram illustrating one configuration of a dimmer/switch 302 in which systems and methods for managing energy may be implemented. The dimmer/switch 302 of FIG. 3 may be one configuration of the electronic device 102 described above in connection with FIG. 1. In some configurations, one or more of the elements described in connection with FIG. 3 may be configured with similar functionality to corresponding elements described in connection with FIG. 1.

The dimmer/switch 302 may receive a voltage waveform from a mains voltage 338. The dimmer/switch 302 may also include an internal power supply 312 coupled to the mains voltage 338 that provides power to each module/block within the dimmer/switch 302. The mains voltage 338 may provide power to the dimmer/switch 302 via a line 301a-d coupled to a load switch 350, a power supply 312, a voltage sensor 306, a zero-cross detector 308, auxiliary indicators 348 and auxiliary controls 346. The mains voltage 338 may also be coupled to the power supply 312, the voltage sensor 306, the zero-cross detector 308, the auxiliary indicators 348 and a load 340 via a neutral line 303a-d. The neutral line 303a-d may be a return line for different modules/blocks within the dimmer/switch 302 providing a return to a ground reference voltage.

The dimmer/switch 302 may include a microprocessor 318. The microprocessor 318 may include some or all of the components of the computing module 118 described above in connection with FIG. 1. The microprocessor 318 may include or be coupled to a ZigBee radio 352. The ZigBee radio 352 may be used for communicating with other electronic devices. The voltage sensor 306 may be coupled to the microprocessor 318 via an A/D converter 354. The current sensor 330 may be coupled to the microprocessor 318 via a second A/D converter 356. The current sensor 330 may also be coupled to a gain variable buffer 334. The gain variable buffer 334 may be coupled to a windowed peak detector 332 and the second A/D converter 356. In some configurations, the A/D converters 354, 356 are part of the microprocessor 318. The microprocessor 318 may also be coupled to the zero-cross detector 308, the auxiliary controls 346 and the auxiliary indicators 348. The microprocessor 318 may also be coupled to the load switch 350 for engaging or disengaging the load 340 via instruction from a load switch control 314.

Figure 4:
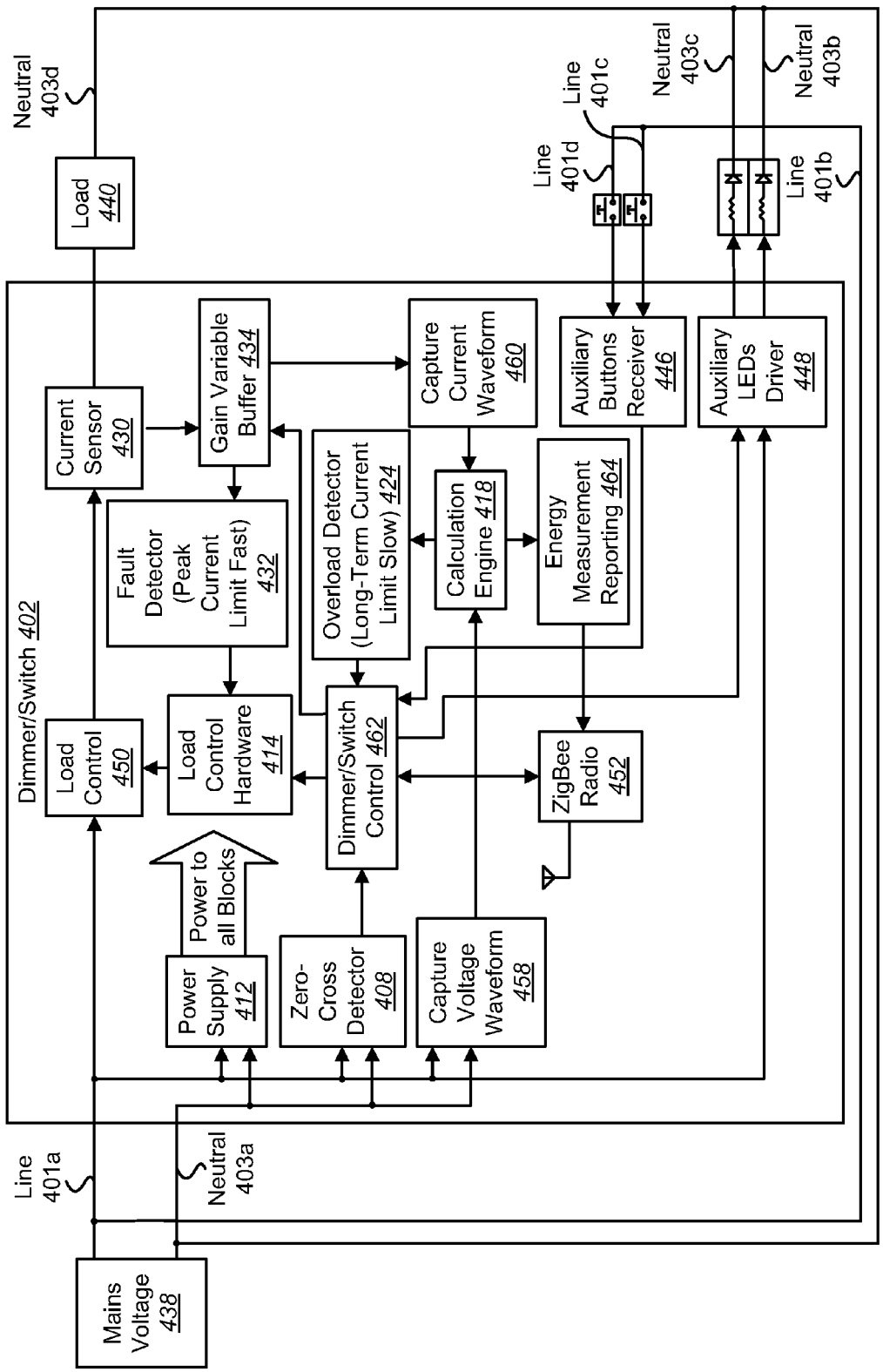
FIG. 4 is a block diagram illustrating another configuration of a dimmer/switch in which systems and methods for managing energy may be implemented.

FIG. 4 is a block diagram illustrating another configuration of a dimmer/switch 402 in which systems and methods for managing energy may be implemented. The dimmer/switch 402 may be one configuration of the electronic device 102 and/or the dimmer/switch 302 described above in connection with FIG. 1 and FIG. 3. In some configurations, one or more of the elements described in connection with FIG. 4 may be configured with similar functionality to corresponding elements described in connection with FIG. 1 and/or FIG. 3.

The dimmer/switch 402 may receive a voltage waveform from a mains voltage 438. The dimmer/switch 402 may also include an internal power supply 412 coupled to the mains voltage 438 that provides power to each module/block within the dimmer/switch 402. The mains voltage 438 may provide power to the dimmer/switch 402 via a line 401a-d coupled to a load control 450, a power supply 412, a zero-cross detector 408, a capture voltage waveform block 458, auxiliary buttons receiver 446 and an auxiliary LEDs driver 448. The mains voltage 438 may also be coupled to the power supply 412, zero-cross detector 408, capture voltage waveform block 458, auxiliary LEDs driver 448 and the load 440 via a neutral line 403*a-d*. The neutral line 403*a-d* may be a return line for different modules/blocks within the dimmer/switch 402 providing a return to a ground reference voltage. The dimmer/switch 402 may also include a load control 450 coupled to a load control hardware 414 and a current sensor 430. The load control hardware 414 may be coupled to a fault detector 432 (e.g., peak current limit fast) and a microprocessor. The fault detector 432 may be coupled to a gain variable buffer 434. The gain variable buffer 434 may be coupled to the current sensor 430 and the microprocessor. Moreover, each of the power supply 412, zero-cross detector 408, capture voltage waveform block 458, auxiliary LEDs driver 448 and auxiliary buttons receiver 446 may be coupled to a microprocessor housed within the dimmer/switch 402.

Many of the components shown on the dimmer/switch 402 of FIG. 4 may be implemented within a microprocessor. For example, the microprocessor may include a dimmer/switch control 462, an overload detector 424 (e.g., long-term current limit slow), a calculation engine 418, a capture current waveform block 460, an energy measurement reporting block 464 and a ZigBee radio 452. Some or all of these components may be housed within the microprocessor and coupled to other modules/blocks within the dimmer/switch 402. For example, the dimmer/switch control 462 may be coupled to the zero-cross detector 408, the load control hardware 414, the gain variable buffer 434, the ZigBee radio 452, the auxiliary LEDs driver 448 and the auxiliary buttons receiver 446. The overload detector 424 may be coupled to the calculation engine 418. The calculation engine 418 may be coupled to the capture voltage waveform block 458, the capture current waveform block 460 and the energy measurement reporting block 464. The energy measurement reporting block 464 may be coupled to the ZigBee radio 452.

Figure 5:
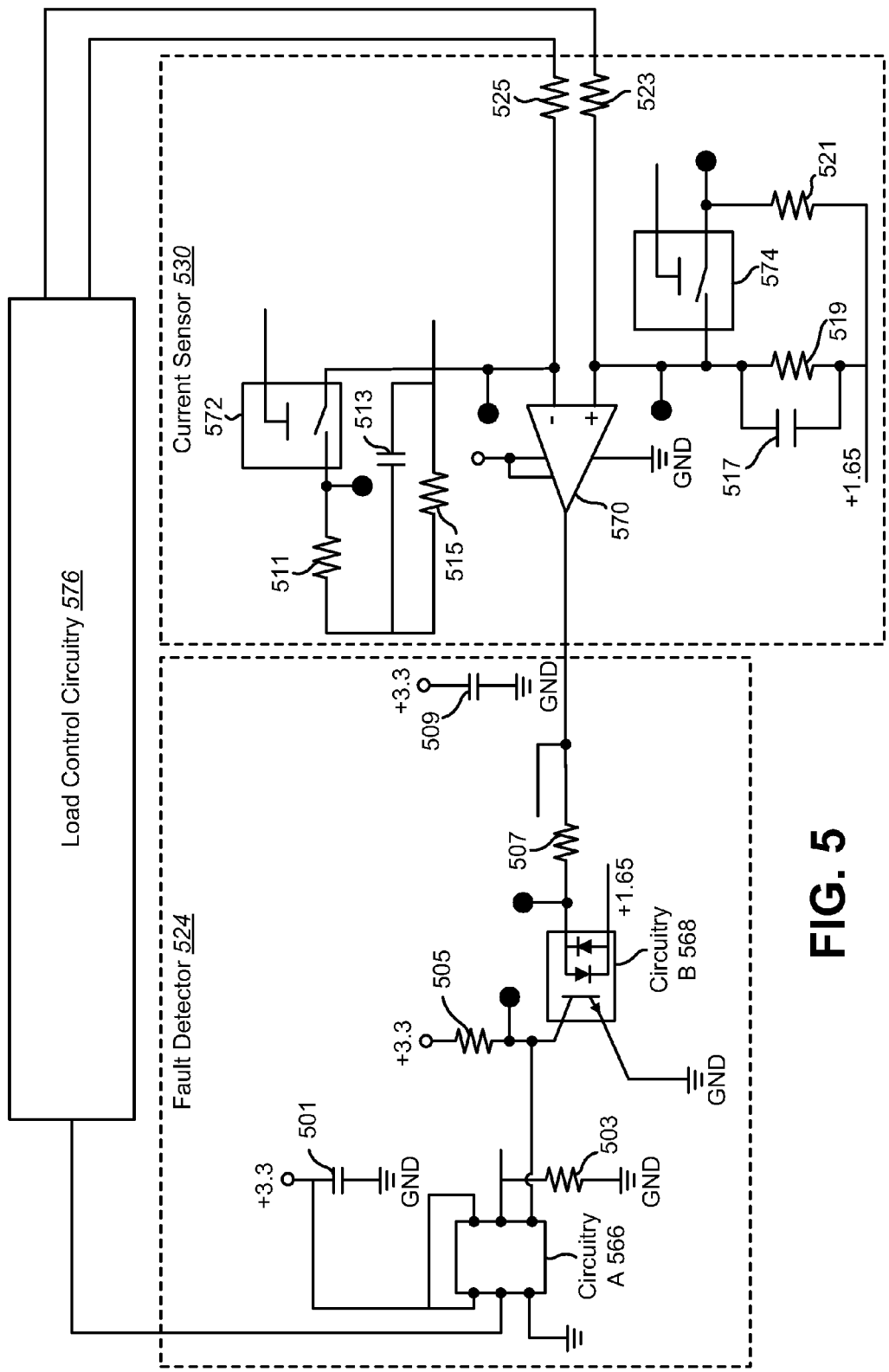
FIG. 5 is a circuit diagram illustrating one configuration of a wall box device for managing energy.

FIG. 5 is a circuit diagram illustrating one configuration of a wall box device for managing energy. The circuit may be one configuration of components found within the electronic devices 102, 302, 402 described above in connection with FIGS. 1, 3 and 4. The electronic device 102 may include circuitry A 566, circuitry B 568 and an amplifier 570. It should be noted that one or more of the various circuitries described herein may be implemented in chip packages. Circuitry A 566, circuitry B 568 and the amplifier 570 may be implemented as part a fault detector 524 and current sensor 530. The fault detector 524 and current sensor 530 may be implemented within the computing module 118 and/or the current sensor module 128. Circuitry A 566, circuitry B 568 and the amplifier 570 may also detect other fault conditions, such as current exceeding one or multiple levels of threshold current passing through the electronic device 102 in order to determine whether load control circuitry 576 should engage or disengage operation of a load 140. The electronic device 102 may also include load control circuitry 576 for controlling and/or managing a load 140. The load control circuitry 576 may include circuitry for driving a switch (e.g., mechanical relay). The load control circuitry 576 may also include circuitry for driving a dimmer (e.g., solid state semiconductor).

The current sensor 530 may also include a first analog switch 572 and a second analog switch 574. The analog switches 572, 574 may be used to control a threshold value of current flowing through the electronic device 102. For example, a specific load 140 may have an inrush current and settling time specifications that indicate different levels of current that may safely flow through the electronic device 102 at a given time of operation. The analog switches 572, 574 may be used to modify a threshold value based on an appropriate amount of current that should be allowed to pass through the electronic device 102. The analog switches 572, 574 may be adjusted multiple times during operation of a load 140 to adjust for current variations. Further, the analog switches 572, 574 may assist the current sensor module 128 and the computing module 118 in determining whether a current exceeds a threshold value and determining whether to engage or disengage the load 140 to protect components within the electronic device 102. In some configurations, the electronic device 102 may include additional analog switches for implementing detection of additional threshold current values.

The circuit of FIG. 5 also shows one configuration of resistors, capacitors and other discrete components that may be implementing within the electronic device 102. For example, a first pin of circuitry A 566 may be coupled to a supply voltage and a capacitor 501 coupled to ground. A second pin of circuitry A 566 may be coupled to the load control circuitry 576. A third pin of circuitry A 566 may be coupled to ground. A fourth pin of circuitry A 566 may be coupled to a resistor 505 that is coupled to a supply voltage and a first pin of circuitry B 568. A fifth pin of circuitry A 566 may be coupled to a resistor 503 that is coupled to ground. The sixth pin of circuitry A 566 may be fed back to the first pin of circuitry A 566. The configuration of the resistors, capacitors and other discrete components may also include a capacitor 509 coupled between a supply voltage and a ground reference.

Circuitry B 568 may include one or more diodes and a transistor within the packaging of circuitry B 568. As described above, the first pin of circuitry B 568 may be coupled to a resistor 505 that is coupled to a supply voltage. A second pin of circuitry B 568 may be coupled to ground. A third pin of circuitry B 568 may be coupled to a reference voltage between the ground and the supply voltage. A fourth pin of circuitry B 568 may be coupled to a resistor 507 and to other components within the electronic device 102. The resistor 507 may be coupled to an output of the amplifier 570 as well as being coupled to other components within the electronic device 102.

The amplifier 570 may be coupled to a supply voltage and to ground. As described above, the output of the amplifier may be coupled to the resistor 507 as well as being coupled to other components within the electronic device 102. The negative input of the amplifier 570 may be coupled to a resistor 525 which is coupled to the load control circuitry 576. The negative input of the amplifier 570 may also be coupled to other components within the electronic device 102. The negative input of the amplifier 570 may also be coupled to a resistor 515 and a capacitor 513 in parallel. The negative input of the amplifier may also be coupled to a first analog switch 572 connected to a resistor 511 and other components within the wireless device 102. The first analog switch 527 and the resistor 511 may be in parallel to the capacitor 513 and the resistor 515. The positive input of the amplifier 570 may be coupled to a resistor 523 which is coupled to the load control circuitry 576. The positive input of the amplifier 570 may be coupled to other components within the electronic device 102. The positive input of the amplifier 570 may also be coupled to a capacitor 517 and a resistor 519 in parallel. The positive input of the amplifier 570 may also be coupled to a second analog switch 574 which is coupled to a resistor 521. The second analog switch 574 and the resistor 521 may be in parallel to the resistor 519 and the capacitor 517. The capacitor 517, resistor 519 and resistor 521 may be coupled to a reference voltage between the supply voltage and the ground.

Figure 6:
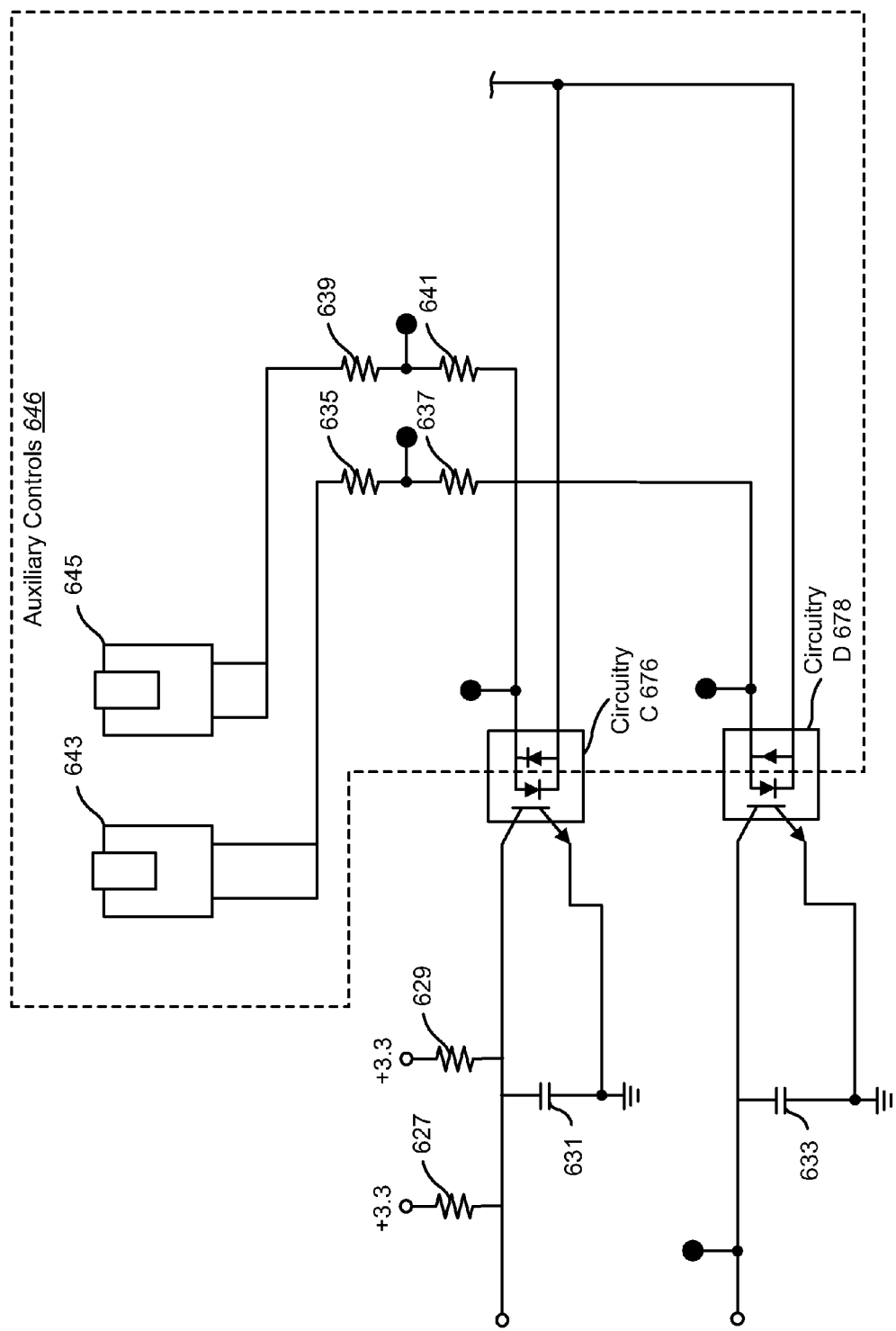
FIG. 6 is a circuit diagram illustrating one configuration of auxiliary controls that may be implemented in a wall box device.

FIG. 6 is a circuit diagram illustrating one configuration of auxiliary controls 646 that may be implemented in a wall box device. The auxiliary controls 646 may be one configuration of the auxiliary controls 146 described above in connection to FIG. 1. The auxiliary controls 646 may include circuitry C 676 and circuitry D 678. Circuitry C 676 and circuitry D 678 are chips that include discrete components. In one configuration, circuitry C 676 and circuitry D 678 include a transistor and diodes implemented within a packaging. A first pin of circuitry C 676 may be coupled to a resistor 629 and a capacitor 631. The resistor 629 may each be coupled to a supply voltage. The capacitor 631 may be coupled to ground and a second pin of circuitry C 676. A third pin of circuitry C 676 may be coupled to a return line. A fourth pin of circuitry C 676 may be coupled to other components within the electronic device 102. The fourth pin of circuitry C 676 may also be coupled to a resistor 641. The resistor 641 may be coupled to other components within the electronic device 102 and a resistor 639. The resistor 639 may be coupled to a first screw terminal 645.

A first pin of circuitry D 678 may be coupled to a capacitor 633 and a resistor 627. The first pin may also be coupled to other components of the electronic device 102. The resistor 627 may be coupled to a supply voltage. The capacitor 633 may be coupled to ground and a second pin of circuitry D 678. A third pin of circuitry D 678 may be coupled to a return line. A fourth pin of circuitry D 678 may be coupled to other components within the electronic device 102. The fourth pin of circuitry D 678 may also be coupled to a resistor 637. The resistor 637 may be coupled to other components within the electronic device 102 and a resistor 635. The resistor may be coupled to a second screw terminal 643.

Figure 7:
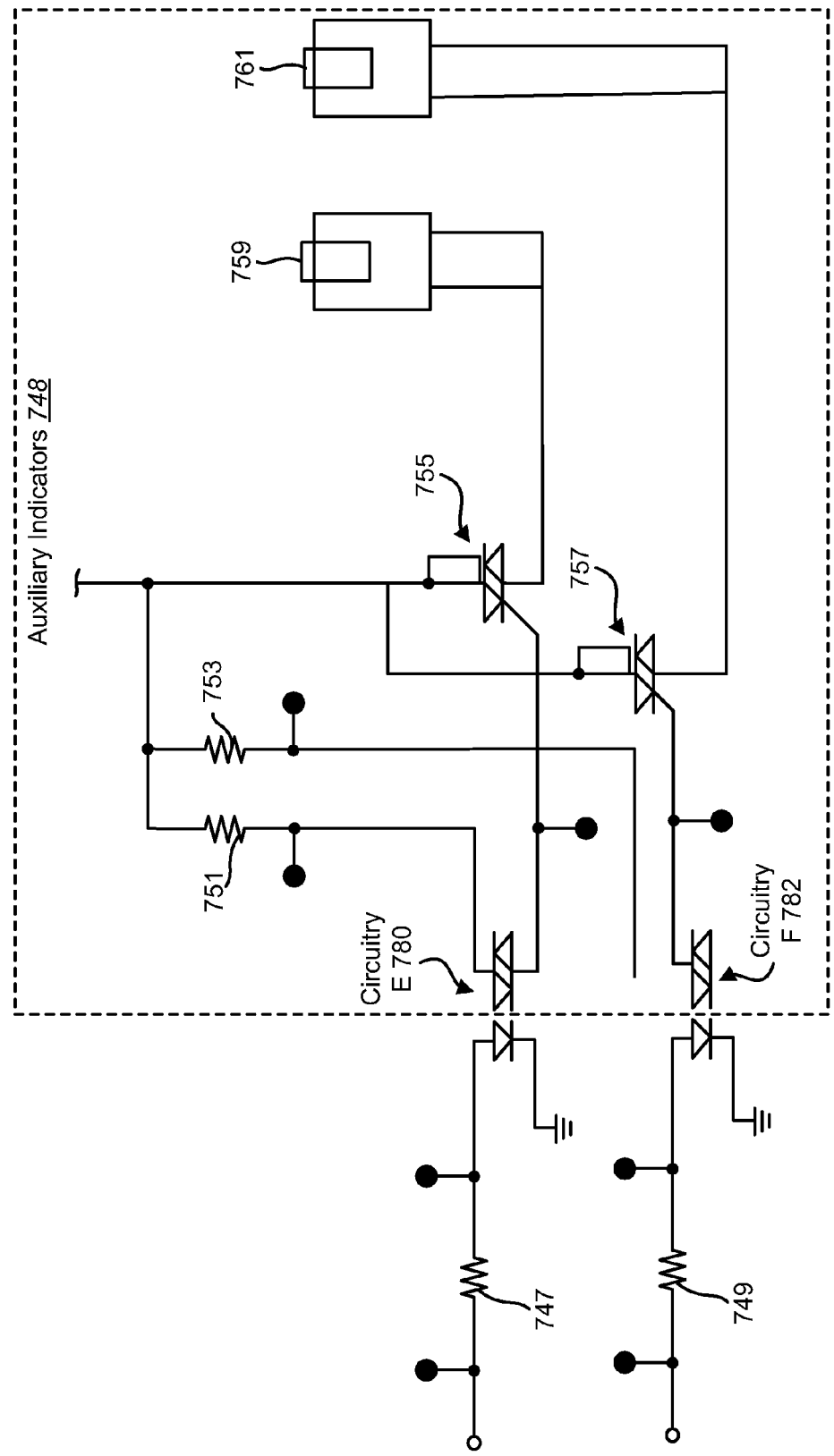
FIG. 7 is a circuit diagram illustrating one configuration auxiliary indicators that may be implemented in a wall box device.

FIG. 7 is a circuit diagram illustrating one configuration auxiliary indicators 748 that may be implemented in a wall box device. The auxiliary indicators 748 may be one configuration of the auxiliary indicators 148 described above in connection to FIG. 1. The auxiliary indicators 748 may include circuitry E 780 and circuitry F 782. Circuitry E 780 and circuitry F 782 are chips that include discrete components. In one configuration, the discrete components of circuitry E 780 and circuitry F 782 are housed within a packaging. A first pin of circuitry E 780 may be coupled to other components within the electronic device 102. The first pin may also be coupled to a resistor 747 which is coupled to other components within the electronic device 102. A second pin of circuitry E 780 may be coupled to ground. A third pin of circuitry E 780 may be coupled to other components within the electronic device 102 and a transistor 755. The transistor 755 may be coupled to the line voltage. The transistor 755 may also be coupled to a first screw terminal 759. The transistor 755 may also be coupled to another transistor 757. A fourth pin of circuitry E 780 may be coupled to other components within the electronic device 102 and a resistor 751. The resistor 751 may be coupled to a resistor 753 and a line voltage.

A first pin of circuitry F 782 may be coupled to other components within the electronic device 102. The first pin may also be coupled to a resistor 749. A second pin of circuitry F 782 may be coupled to ground. A third pin of circuitry F 782 may be coupled to other components within the electronic device 102 and the transistor 757. The transistor 757 may be coupled to a second screw terminal 761. A fourth pin of circuitry F 782 may be coupled to the resistor 753 coupled to the line voltage.

Figure 8:
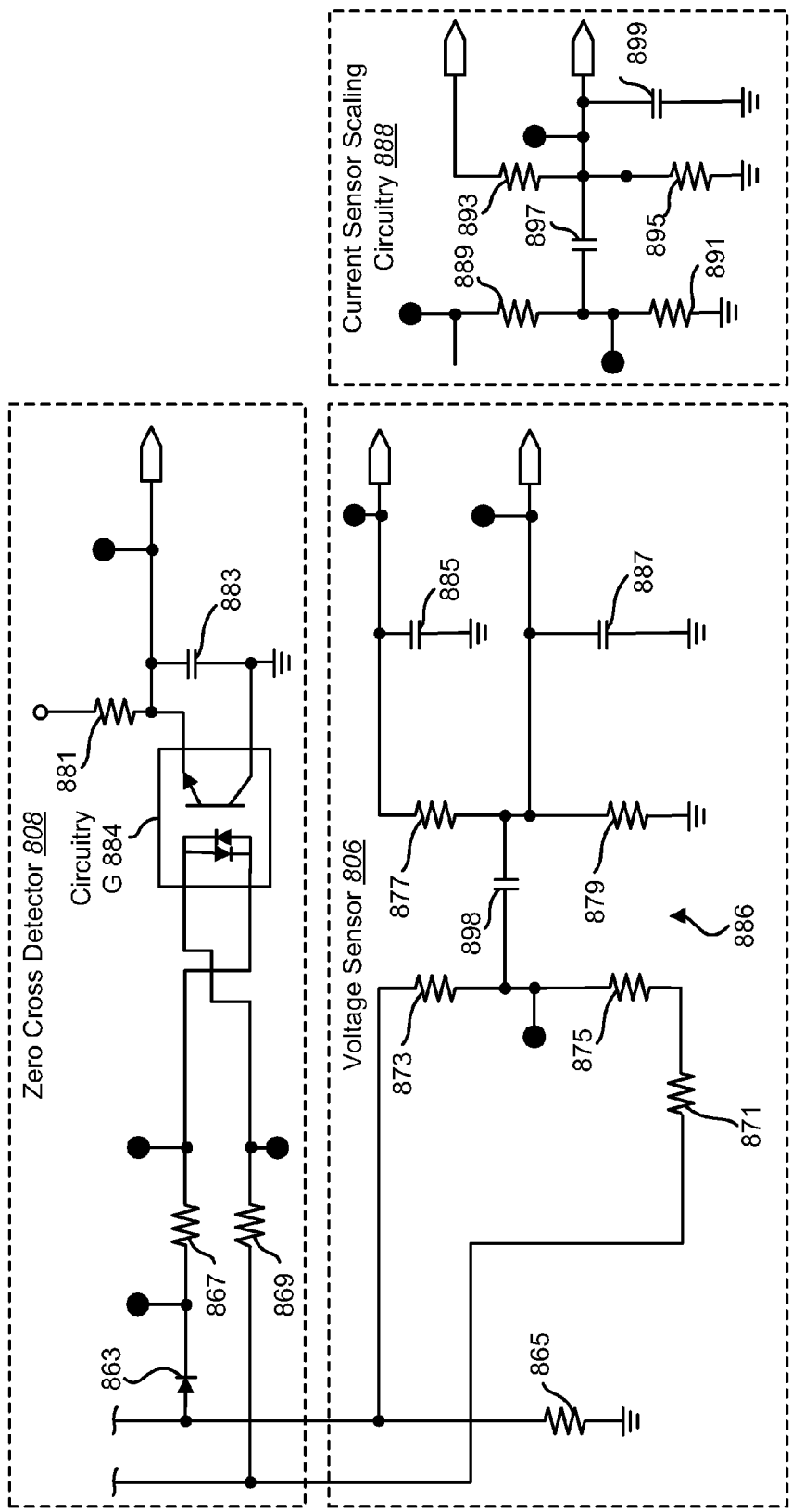
FIG. 8 is a circuit diagram illustrating one configuration of a voltage detector and of a current detector.

FIG. 8 is a circuit diagram illustrating one configuration of circuitry that may be implemented in the voltage sensor module 104 and the current sensor module 128. In one configuration, the electronic device 102 may include circuitry G 884 and other circuitry to implement a zero-cross detector 808.

The zero-cross detector 808 may be one configuration of the zero-cross detector 108 described above in connection with FIG. 1. A first pin of circuitry G 884 may be coupled to other components within the electronic device 102 and a resistor 869. The resistor 869 may be coupled to a return line and a resistor 871. A second pin of circuitry G 884 may be coupled to other components within the electronic device 102 and a resistor 867. The resistor 867 may be coupled to other components within the electronic device 102 and to an output of a diode 863. The input of the diode 863 may be coupled to a line voltage. A third pin of circuitry G 884 may be coupled to a capacitor 883 and ground. A fourth pin of circuitry G 884 may be coupled to a resistor 881, the capacitor 883 and other component within the electronic device 102. The resistor 881 may be coupled to a supply voltage. The capacitor 883 may be coupled to ground and the third port of circuitry G 884.

In some configurations, the voltage sensor module 104 may include circuitry to implement a voltage sensor 806. For instance, the voltage sensor 806 illustrated in FIG. 8 may be one example of and/or may provide similar elements and functionality of the voltage sensor 106 described above in connection to FIG. 1. The voltage sensor 806 may include a network of resistors 886 for scaling a voltage (e.g., mains voltage, power supply). The network of resistors 886 may include a first resistor 873, second resistor 875, third resistor 877 and fourth resistor 879. The first resistor 873 may be coupled to the second resistor 875 and other components within the electronic device 102. The third resistor 877 may be coupled to the second resistor 879. The first resistor 873 may be coupled to a line voltage and a resistor 865 that is coupled to ground. The second resistor 875 may be coupled to a resistor 871 that is coupled to a return line. The third resistor 877 may be coupled to a capacitor 885 and other components within the electronic device 102. The capacitor 885 may be coupled to ground. The fourth resistor 879 may be coupled to a capacitor 887 and other components within the electronic device 102. The capacitor 887 may be coupled to ground. Each of the first resistor 873, second resistor 875, third resistor 877 and fourth resistor 879 may be coupled to each other via a capacitor 898.

In some configurations, the current sensor module 128 may also include circuitry to implement current sensor scaling circuitry 888 as illustrated in FIG. 8. The current sensor scaling circuitry 888 may be implemented in one configuration of the current sensor module 128 described above in connection to FIG. 1. For example, the current sensor scaling circuitry 888 may interface between a current sensor and a microprocessor. The current sensor scaling circuitry 888 may include a network of resistors for scaling a current. The network of resistors may include a first resistor 889, second resistor 891, third resistor 893 and fourth resistor 895. The first resistor 889 may be coupled to other components within the electronic device 102. The first resistor 889 may also be coupled to the second resistor 891. The second resistor 891 may be coupled to ground. The third resistor 893 may be coupled to voltage reference. The third resistor 893 may also be coupled to the fourth resistor 895 and to other components within the electronic device 102. The fourth resistor 895 may be coupled in parallel to a capacitor 899 and a current reference. The resistor 895 and capacitor 899 may each be coupled to ground. Each of the first resistor 889, second resistor 891, third resistor 893 and fourth resistor 895 may be coupled together via a capacitor 897.

Figure 9:
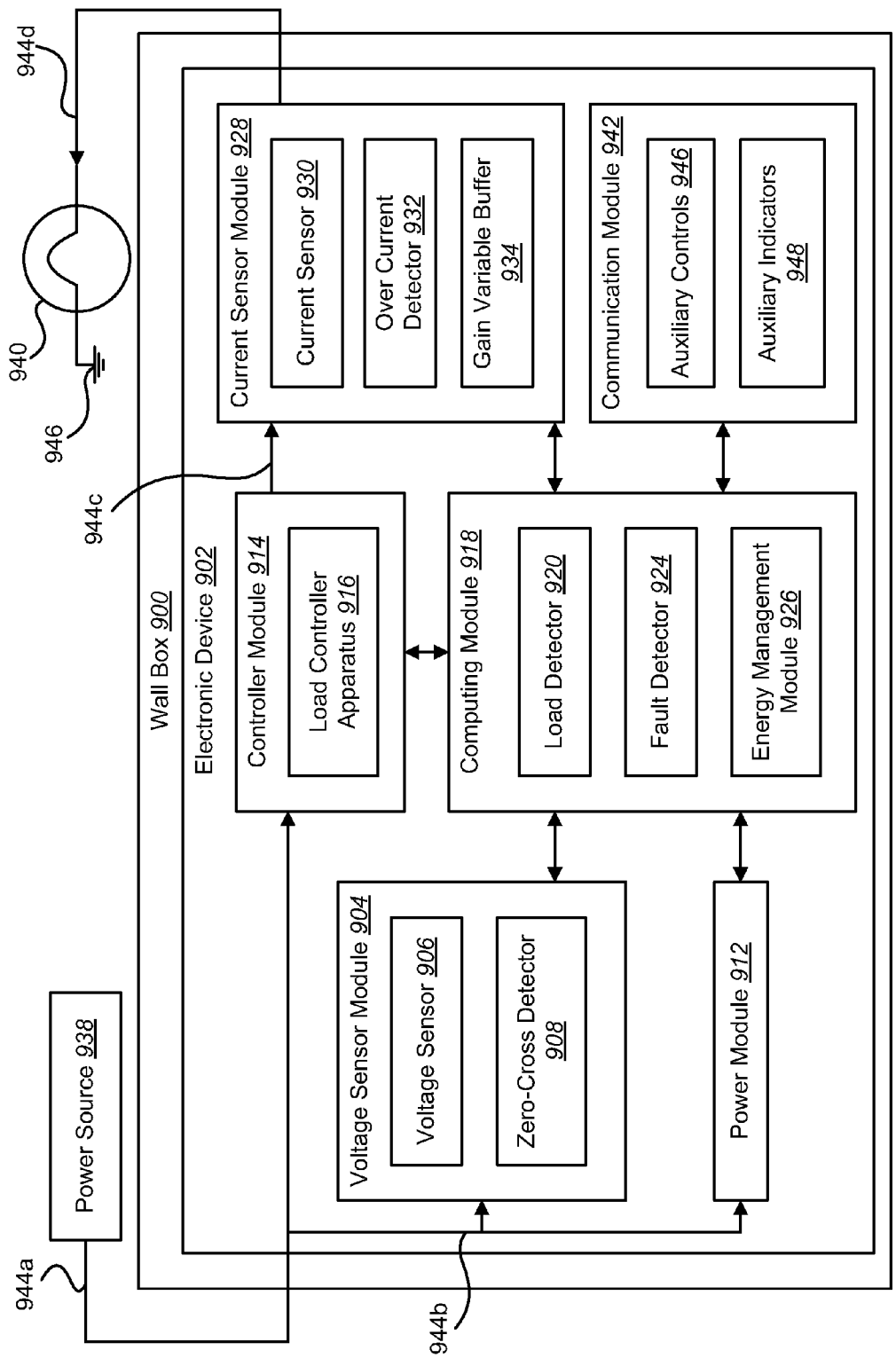
FIG. 9 is a block diagram illustrating one implementation of a wall box device for managing the energy usage of an incandescent lamp.

FIG. 9 is a block diagram illustrating one implementation of a wall box device for managing the energy usage of an incandescent lamp 940. The wall box 900 and the electronic device 902 may be one configuration of the wall box 100 and electronic device 102 described above in connection with FIG. 1. The electronic device 902 includes a voltage sensor module 904, a current sensor module 928, a computing module 918, a power module 912, a controller module 914 and a communication module 942. The voltage sensor module 904 may include a voltage sensor 906 and a zero-cross detector 908. The controller module 914 may include a load controller apparatus 916. The computing module 918 may include a load detector 920, a fault detector 924 and an energy management module 926. The current sensor module 928 may include a current sensor 930, an over current detector 932 and a gain variable buffer 934. The communication module 942 may include auxiliary controls 946 and auxiliary indicators 948. The electronic device 902 may be housed within a wall box 900.

The electronic device 902 may be coupled to an incandescent lamp 940 with a high voltage AC feed line 944d. The incandescent lamp 940 may be coupled to a ground 946. A power source 938 may be coupled to the electronic device 902 via a line 944a. The power source 938 may also be coupled to the voltage sensor module 904 and the power module 912 via a line 944b. The controller module 914 may be coupled to the current sensor module 928 via a line 944c.

Figure 10:
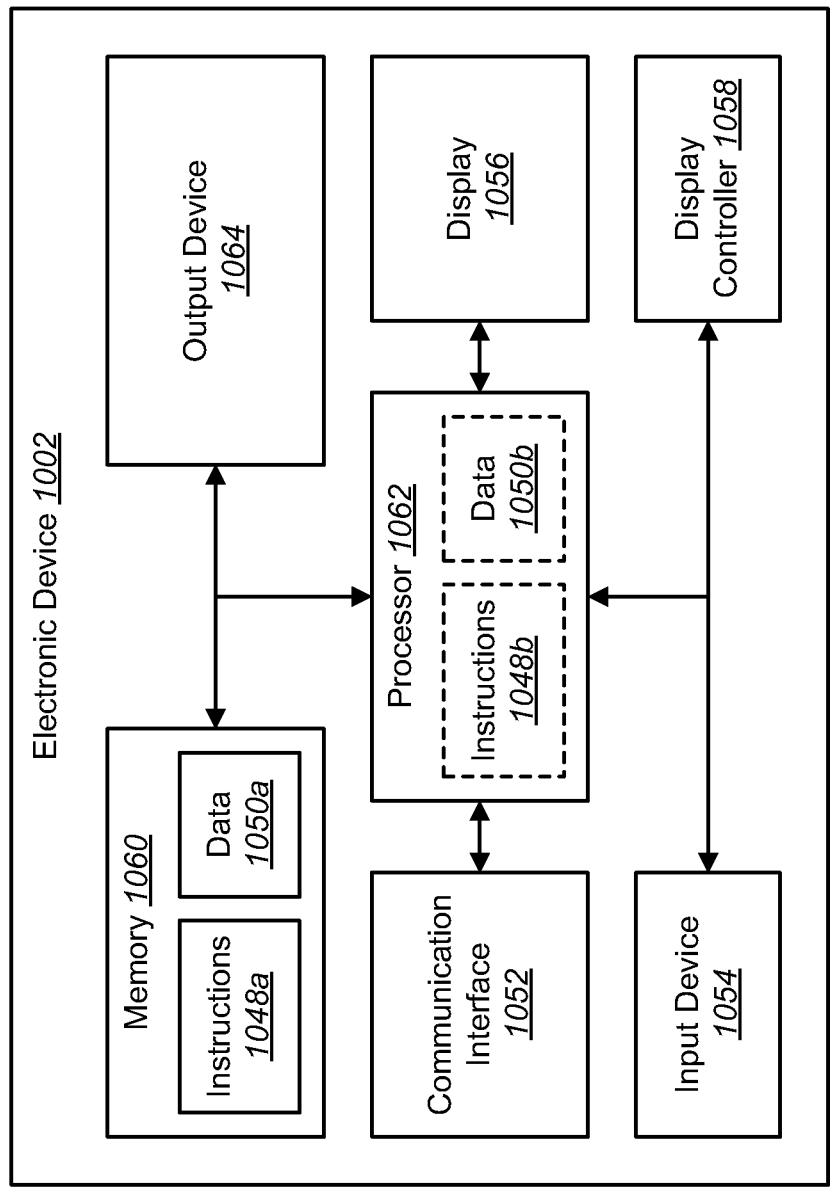
FIG. 10 illustrates various components that may be utilized on an electronic device.

FIG. 10 illustrates various components that may be utilized on an electronic device 1002. One or more of the electronic device 102, 302, 402 and 902 described previously may be configured similar to the electronic device 1002 illustrated in FIG. 10. For example, the electronic device 1002 may be configured to perform the method 200 described above. The electronic device 1002 may include a memory 1060, a communication interface 1052, an input device 1054, a processor 1062, an output device 1064, a display 1056 and a display controller 1058. The memory 1060 may store instructions 1048a and data 1050a. The processor 1062 may operate on instructions 1048b and data 1050b.

The term "discrete circuit" refers to an electronic circuit built out of discrete components. Examples of discrete components include resistors, capacitors, inductors, transformers, transistors, etc. In some configurations, a discrete circuit may not be a solid state integrated circuit that performs all of the functions described herein. However, a discrete circuit may include one or more discrete components contained in the same packaging (e.g., TRIAC, bridge rectifier, solid state relay, etc.). In some configurations, a discrete circuit made from discrete components refers to a circuit having separate components or circuits that perform individual finite functions. For instance, examples of a discrete circuit may include the voltage sensor module 104, controller module 114, computing module 118 and current sensor module 128 that may perform separate and discrete functions while being implemented within an electronic device 102 within a wall box 100. Moreover, each module within the electronic device 102 may include discrete components or discrete circuits within each module. In some instances, the term "circuit" may refer to a circuit in its entirety, for example, including the impedance of the wall box device and the impedance of the load.

As used herein, the term "coupled" and other variations thereof may mean that one element is connected to another element directly or indirectly. For example, if a first element is coupled to a second element, the first element may be connected directly to the second element or may be connected to the second element through another element.

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The term "computer-readable medium" refers to any available medium that can be accessed by a computer or processor. A computer-readable medium may be non-transitory and tangible. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An electronic device for managing energy, comprising:
   a voltage sensor module that monitors a voltage waveform, wherein the voltage sensor module comprises discrete components;
   a current sensor module that monitors a current waveform, wherein the current sensor module comprises discrete components;
   a computing module coupled to the voltage sensor module and to the current sensor module that determines a difference in phase between the voltage waveform and the current waveform;
   a zero-cross sensor for aligning the voltage waveform and the current waveform so that the difference in phase between the voltage waveform and the current waveform can be determined, wherein the zero-cross sensor comprises discrete components;
   a control module coupled to the computing module that controls a load based on the voltage waveform, current waveform and the difference in phase between the voltage waveform and the current waveform, wherein the control module comprises discrete components, and wherein the voltage sensor module, current sensor module, computing module and control module are housed within a wall box;
   wherein the electronic device comprises a light dimmer.

2. The electronic device of claim 1, further comprising a fault detector for detecting whether the current waveform exceeds a threshold, and wherein the fault detector comprises discrete components.

3. The electronic device of claim 2, wherein the control module disengages the load if the fault detector detects that the current waveform exceeds the threshold.

4. The electronic device of claim 2, wherein the threshold corresponds to a first level of sensitivity during startup of the electronic device, and wherein the threshold correspond to a second level of sensitivity during regular operation of the electronic device.

5. The electronic device of claim 1, wherein the computing module manages energy usage of the load.

6. The electronic device of claim 5, wherein managing energy usage of the load comprises determining a type of the load based on the difference in phase between the voltage waveform and the current waveform.

7. The electronic device of claim 6, wherein managing energy usage of the load comprises adapting the way the load is driven based on the type of the load.

8. The electronic device of claim 5, wherein managing energy usage of the load comprises determining a power factor of the load.

9. The electronic device of claim 5, wherein managing energy usage of the load comprises reporting energy usage to another electronic device.

10. The electronic device of claim 1, wherein the wall box is approximately 86 millimeters tall, 86 millimeters wide and 35 millimeters deep.

11. A method for managing energy with an electronic device, comprising:
   monitoring a voltage waveform from a voltage sensor module in an electronic device, wherein the voltage sensor module comprises discrete components;
   monitoring a current waveform from a current sensor module in the electronic device, wherein the current sensor module comprises discrete components;
   aligning the voltage waveform and the current waveform by a zero-cross sensor in the electronic device, wherein the zero-cross sensor comprises discrete components;
   determining a difference in phase between the voltage waveform and the current waveform based on the aligned voltage waveform and current waveform, wherein the determining is performed by a computing module in the electronic device, wherein the computing module is coupled to the voltage sensor module and the current sensor module; and
   controlling a load based on the voltage waveform, current waveform and the difference in phase between the voltage waveform and the current waveform from a control module in the electronic device, wherein the control module comprises discrete components, and wherein the voltage sensor module, current sensor module, computing module and control module are housed within a wall box;
   wherein the electronic device comprises a light dimmer.

12. The method of claim 11, further comprising detecting whether the current waveform exceeds a threshold from a fault detector in the electronic device, wherein the fault detector comprises discrete components.

13. The method of claim 12, wherein the control module disengages the load if the fault detector detects that the current waveform exceeds the threshold.

14. The method of claim 11, further comprising managing energy usage of the load from the computing module.

15. The method of claim 14, wherein managing energy usage of the load comprises determining a type of load based on the difference in phase between the voltage waveform and the current waveform.

16. The method of claim 15, wherein managing energy usage of the load comprises adapting the way the load is driven based on the type of the load.

17. The method of claim 14, wherein managing energy usage of the load comprises determining a power factor of the load.

18. The method of claim 14, wherein managing energy usage of the load comprises reporting energy usage to another electronic device.

* * * * *

UNITED STATES PATENT AND TRADEMARK OFFICE
CERTIFICATE OF CORRECTION

Page 1 of 1

PATENT NO.         : 9,142,962 B2
APPLICATION NO.    : 13/598076
DATED              : September 22, 2015
INVENTOR(S)        : James K. Russell et al.

It is certified that error appears in the above-identified patent and that said Letters Patent is hereby corrected as shown below:

In the Claims

In column 21, line 36, please delete "correspond" and replace it with --corresponds--.

Signed and Sealed this
Eighth Day of March, 2016

Michelle K. Lee
*Director of the United States Patent and Trademark Office*